US006572204B1

(12) United States Patent
Hedrick et al.

(10) Patent No.: US 6,572,204 B1
(45) **Date of Patent: *Jun. 3, 2003**

(54) NEXT GENERATION VIDEO/REEL PRODUCT

(75) Inventors: Joseph R. Hedrick, Reno, NV (US); Jean Pierre Legras, Reno, NV (US)

(73) Assignee: International Game Technology, Reno, NV (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/680,108

(22) Filed: Oct. 5, 2000

(51) Int. Cl.[7] .................................................. H03K 5/00

(52) U.S. Cl. ...................................... 312/223.1; 312/7.2

(58) Field of Search ........................... 312/223.1, 223.2, 312/223.3, 7.2, 198, 327, 328, 329, 326, 293.2; 463/46, 20

(56) References Cited

U.S. PATENT DOCUMENTS

| | | | | | |
|---|---|---|---|---|---|
| 3,876,271 | A | * | 4/1975 | Skirlock | |
| 4,614,342 | A | * | 9/1986 | Takashima | |
| 5,221,083 | A | * | 6/1993 | Dote | |
| 5,232,191 | A | | 8/1993 | Infanti | |
| 5,431,492 | A | * | 7/1995 | Rothschild et al. | 312/7.2 X |
| 5,542,748 | A | | 8/1996 | Barile | |
| 5,593,048 | A | * | 1/1997 | Johnson | 312/322 X |
| 5,655,822 | A | * | 8/1997 | Roberts et al. | 312/194 |
| 5,676,231 | A | | 10/1997 | Legras et al. | |
| 5,762,617 | A | | 6/1998 | Infanti | |
| 5,779,354 | A | * | 7/1998 | Targetti | 312/107 X |
| 5,826,882 | A | | 10/1998 | Ward | |
| D400,597 | S | | 11/1998 | Hedrick et al. | |
| D403,363 | S | | 12/1998 | McGahn et al. | |
| 5,951,397 | A | | 9/1999 | Dickinson | |
| 6,005,641 | A | * | 12/1999 | Ui | 312/7.2 X |
| D421,277 | S | | 2/2000 | McGahn et al. | |
| 6,050,895 | A | | 4/2000 | Luciano, Jr. et al. | |
| 6,201,703 | B1 | * | 3/2001 | Yamada et al. | |

OTHER PUBLICATIONS

"Casino Seating" brochure; Gary Platt Manufacturing Inc., dated Apr. 1998, 8 pages.

* cited by examiner

*Primary Examiner*—Janet M. Wilkens
(74) *Attorney, Agent, or Firm*—Marshall, Gerstein & Borun

(57) ABSTRACT

As gaming machine housing configured for improved player comfort, relative to upright machines, formed with a reduced footprint relative to slant-top machines. The gaming machine may include a housing configured to carry a video display at an acute angle relative to a vertical datum, selected to optimize player comfort while carrying a video display so as to be visible as players enter a casino floor. In order to increase the number of gaming machines that can be placed in a given area of a casino floor, the gaming machine housing may be configured such that at least a portion of the side housing portions are non-parallel and converge toward each other, thus reducing the footprint of the machine.

27 Claims, 13 Drawing Sheets

NEXT GENERATION VIDEO/REEL PRODUCT

CROSS-REFERENCE TO RELATED APPLICATIONS

This application is related to the following commonly-owned utility patent applications: "Dual Action Door Hinging", by Jean Pierre Legras, Noel D. Brodzinski and Joseph R. Hedrick, Ser. No. 09/679,751, now U.S. Pat. No. 6,474,758 "Integrated Footrests", by Joseph R. Hedrick and Jean Pierre Legras, Ser. No. 09/679,754, now U.S. Pat. No. 6,422,690; "Remote Bet Button", by Joseph R. Hedrick, Jean Pierre Legras and Noel D. Brodzinski, Ser. No. 09/679,753, now abandoned; and a design patent application, entitled "Gaming Machine", by Joseph R. Hedrick and Jean Pierre Legras, Ser. No. 29/130,606, now U.S. Pat. No. D451,150, all filed on Oct. 5, 2000.

BACKGROUND OF THE INVENTION

1. Field of the Invention

The present invention relates to video gaming machines and more particularly to video gaming machines with an improved design to improve player comfort, configured with a footprint to optimize the number of gaming machines in a given area on a casino floor or other gambling facility.

2. Description of the Prior Art

Two major configurations of gaming machines are known; so-called upright and slant-top machines. Upright machines, for example, as disclosed in commonly owned U.S. Pat. No. 5,951,397, include a generally rectangular housing having a video display that is generally perpendicular to a horizontal datum. The front of the housing carries one or more vertical displays as well as game controls on an upper portion of the housing. An access door is provided on a bottom portion, just beneath the vertical displays. The access door provides a portal to the interior of the machine for maintenance and repair.

Such upright machines provide several advantages. First, the vertical displays on the upright machines are visible to players as they enter the gaming floor and thus have the ability to attract more players. Secondly, such upright machines have a relatively smaller footprint than slant-top machines, thus enabling more gaming machines to be placed in a given area on a casino floor. However, there is one serious drawback to such upright machines. That drawback relates to player comfort. As mentioned above, such upright gaming machines include a vertical display. Attention to the vertical display for relatively long periods of time can result in player discomfort. As such, players have a tendency to not play such upright gaming machines for relatively long periods of time.

In order to improve player comfort, slant-type machines have been developed. An example of such a slant-type machines is disclosed in commonly owned U.S. Pat. No. 5,676,231. Such slant-type machines generally include a generally rectangular housing with a relatively large footprint with a playing surface that is angled at an acute angle relative to a horizontal datum. Even though the configuration of such slant-type machines improves player comfort, such slant-top machines have a relatively large footprint relative to upright gaming machines, thus decreasing the number of gaming machines that can be placed in a given area on a casino floor. Moreover, the video displays on such slant top machines are not as visible to players as upright machines, resulting in the games not being as visible as slant-type machines.

Thus, there is a need for an improved gaming machine which provides improved player comfort as well as a relatively small footprint to optimize the number of gaming machines that can be placed in a given area on a casino floor and provides increased visibility.

SUMMARY OF THE INVENTION

According to a first aspect, the present invention may be a housing for a gaming machine. The housing may include a front housing portion, a pair of spaced apart side housing portions, the side housing portions being non-planar and with converging portions. The housing may also include a top housing portion, a rear housing portion and a bottom housing portion which forms a footprint for the machine a portion of the footprint having a trapezoidal configuration.

According to a second aspect, the present invention may be a gaming machine that may include a housing. The housing may include a front housing portion, a pair of spaced apart side housing portions, the side housing portions being non-planar and with converging portions and a top housing portion. The housing may further include a rear housing portion and a bottom housing portion that forms a footprint for the machine a portion of the footprint having a trapezoidal configuration. The gaming machine may further include a video display associated with the housing and adapted to display video gambling game images, a value accepting device associated with the housing and adapted to receive value to be wagered on an outcome of a video gambling game and a control panel associated with the housing and including a plurality of selection devices adapted to allow a user to control play the video gambling game.

According to a third aspect, the present invention may be a gaming machine that may include a housing. The housing may include a front housing portion, a rear housing portion, a pair of intermediate points disposed between the front housing portion and the rear housing portion and a pair of spaced apart side housing portions, each of the side housing portions having a first side housing portion and a second side housing portion, each of the first side housing portions being disposed between the front housing portion and one of the intermediate points, each of the second side housing portions being disposed between the rear housing portion and one of the intermediate points, the second side housing portions comprising converging portions, the side housing portions being non-planar. The gaming machine may also include a video display associated with the housing and adapted to display video gambling game images, a value accepting device associated with the housing and adapted to receive value to be wagered on an outcome of video gambling game and a control panel associated with the housing that allows a user to control play the video gambling game.

According to a fourth aspect, the present invention may be a gaming machine including a housing. The housing may include a front housing portion, a pair of spaced apart side housing portions, each of the side housing portions having a planar portion and a converging portion, each of the planar portions coupled to the front housing portion and each of the converging portions coupled together and a top housing portion. The gaming machine may also include a video display associated with the housing and adapted to display video gambling game images, a value accepting device associated with the housing and adapted to receive value to be wagered on an outcome of a video gambling game and a control panel associated with the housing that allows a user to control play the video gambling game.

According to a fifth aspect, the present invention may be a gaming machine including a housing. The housing may include a front housing portion, a rear housing portion, a pair of intermediate points disposed between the front housing portion and the rear housing portion and a pair of spaced apart side housing portions, each of the side housing portions having a first side housing portion and a second side housing portion that does not lie in the same plane as the first side housing portion, each of the first side housing portions being disposed between the front housing portion and one of the intermediate points, each of the second side housing portions being disposed between the rear housing portion and one of the intermediate points, the second side housing portions comprising converging portions. The gaming machine may also include a video display associated with the housing and adapted to display video gambling game images, a value accepting device associated with the housing and adapted to receive value to be wagered on an outcome of a video gambling game and a control panel associated with the housing that allows a user to control play the video gambling game.

BRIEF DESCRIPTION OF THE DRAWING

These and other advantages of the present invention will be apparent from the following description and attached drawing wherein.

DETAILED DESCRIPTION

Figure 21:
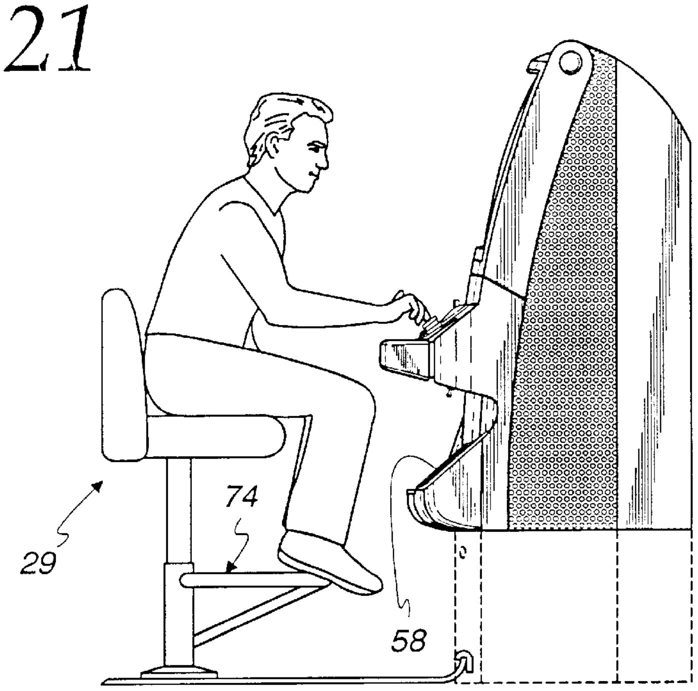
FIG. 21 is a side-elevational view of the gaming machine housing illustrated in FIG. 1, shown with a player and a bet button in a normal position.
Figure 22:
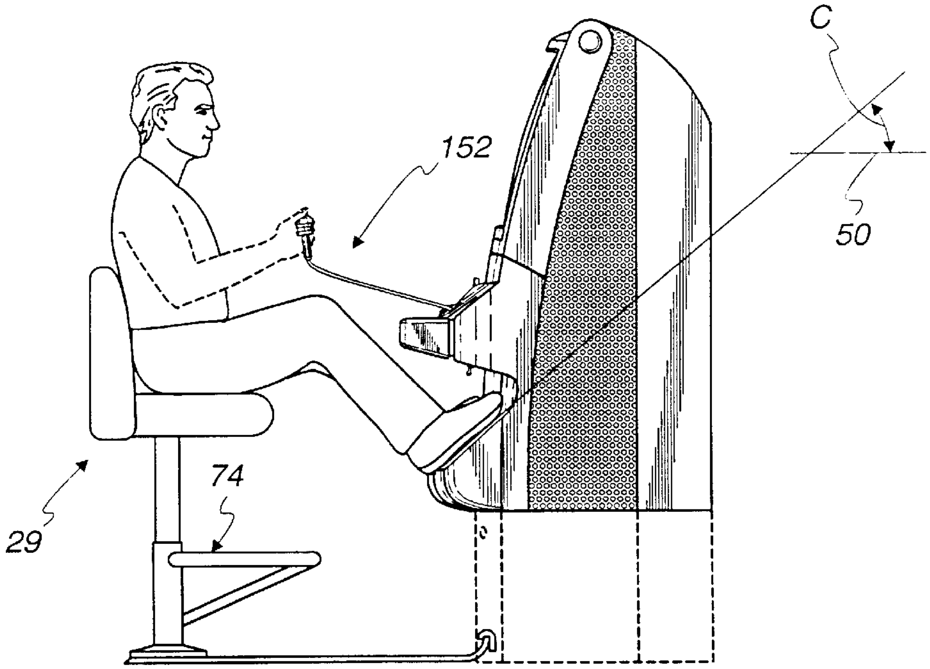
FIG. 22 is similar to FIG. 21 but with the bet button in an extended position and the player in a laid back position.

The present invention relates to an improved gaming machine housing. FIGS. 1–8 illustrate an improved configuration for a gaming machine which provides improved player comfort and also a smaller footprint to optimize the number of gaming machines that can be placed in a given area on a casino floor. FIG. 9 illustrates a cluster of the gaming machines illustrated in FIGS. 1–8 organized in a circular configuration. FIGS. 10–20 relate to an improved door support for an access door for the machine which enables gaming machines to placed closer together. FIGS. 21–24 relate to an extendable bet button for improving player comfort. FIGS. 1–3 and 6 illustrate a footrest that is integrated into the front housing portion which together with a remote bet button improves player comfort as generally shown in FIG. 22.

IMPROVED GAMING MACHINE CONFIGURATION

As best shown in FIGS. 1–8, an improved gaming machine housing configuration, in accordance with the present invention, provides improved player comfort while at the same time provides a relatively small footprint to optimize the number of gaming machines that can occupy a given area on a casino floor. As shown, the gaming machine housing, in accordance with the present invention, generally identified with the reference numeral 30, may be provided with an integral or separate pedestal 32. The height of the pedestal 32 is selected so that the height of the player controls and video display surface are compatible with a standard gaming machine stool 29 (FIGS. 21, 22), for example, as manufactured by Gary Platt Manufacturing Inc. or as disclosed in U.S. Pat. No. 5,232,191, hereby incorporated by reference.

Figure 1:
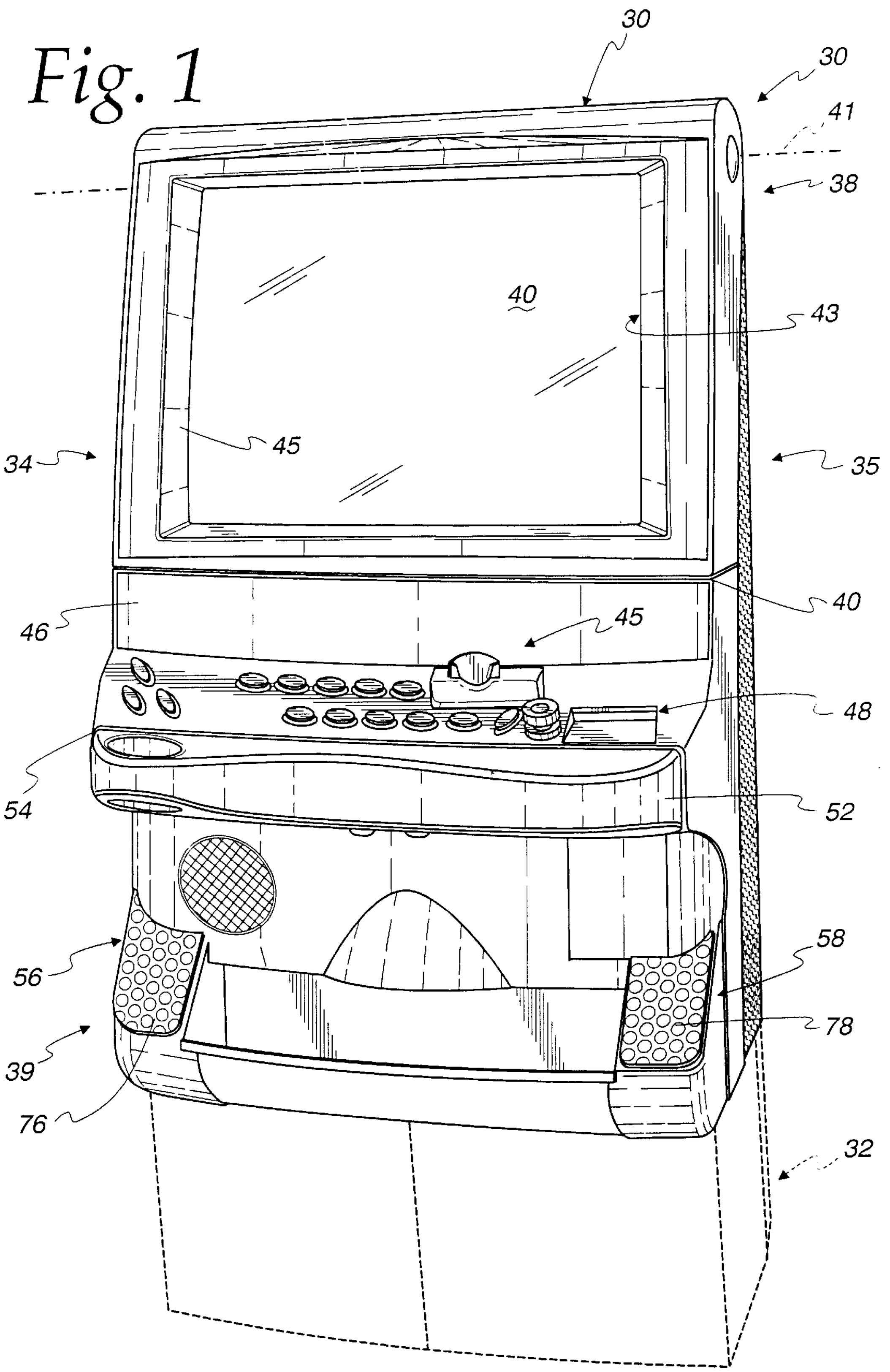
FIG. 1 is a front perspective view of an exemplary embodiment of a gaming machine housing, in accordance with the present invention, shown sitting or a pedestal, illustrated in phantom.
Figure 2:
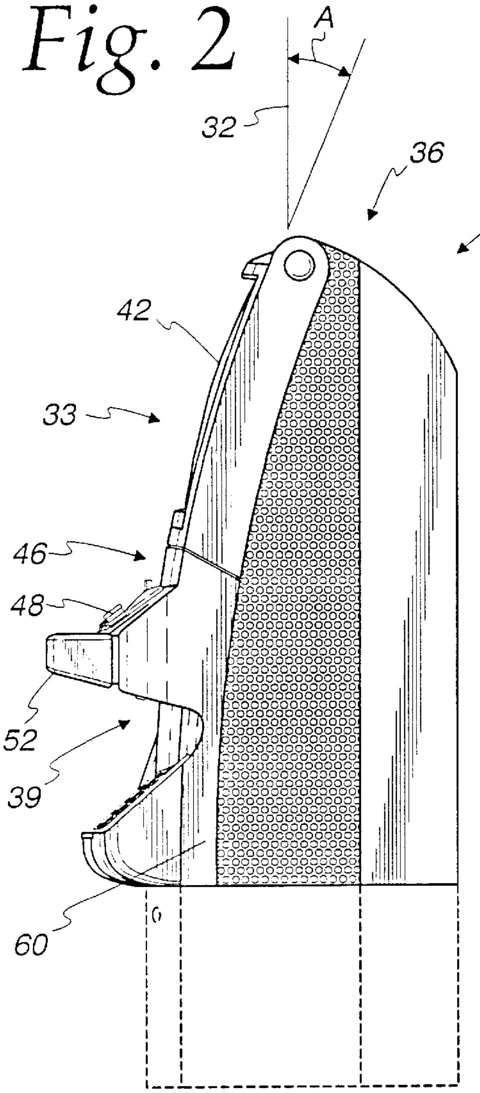
FIG. 2 is a perspective view of the left side of the gaming machine housing illustrated in FIG. 1.
Figure 3:
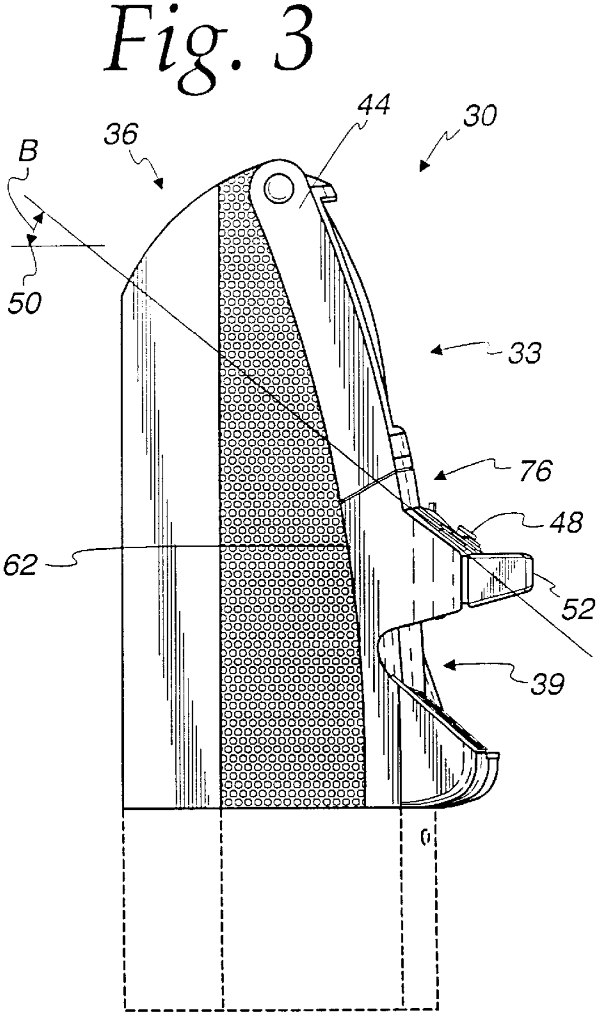
FIG. 3 is a perspective view of the right side of the gaming machine housing illustrated in FIG. 1.
Figure 4:
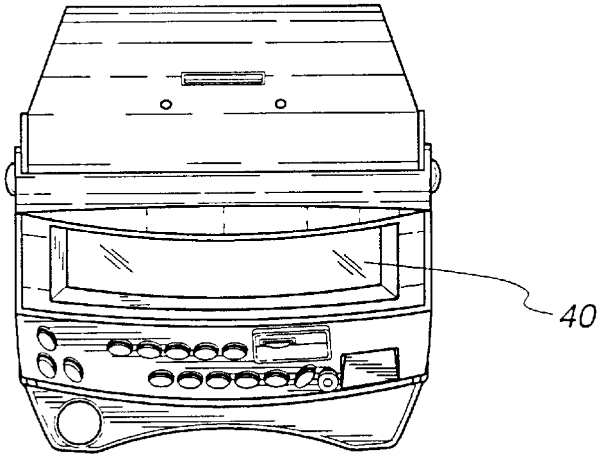
FIG. 4 is top perspective view of the gaming machine housing illustrated in FIG. 1.

As best shown in FIGS. 1–3, the gaming machine housing 30 is of irregular shape and is configured to enable the video display 40 to be carried in a plane at an angle A (FIG. 2), relative to a vertical datum 32. The angle A is selected to improve player comfort in a manner similar to that of a conventional slant top machine while at the same time providing the type of visibility of the video display 40 as conventional upright gaming machines. The angle A may be varied from about 5° to 85°, preferably between 20° and 40°, relative to the vertical datum 32 (FIG. 2). In accordance with another important aspect of the invention, the sides of the housing are formed at least in part to converge toward one another. Such a configuration reduces the footprint of the machine in order to optimize the number of gaming machines that can be placed in a given area on a casino or other gambling facility floor.

Figure 10:
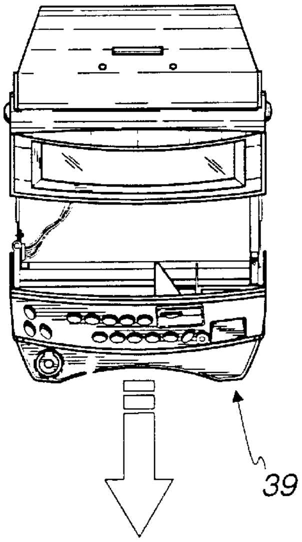
FIG. 10 is a top perspective view of the gaming machine housing illustrated in FIG. 1, shown with a door chassis, in accordance with one aspect of the present invention, in an extended position and the door in closed position.
Figure 11:
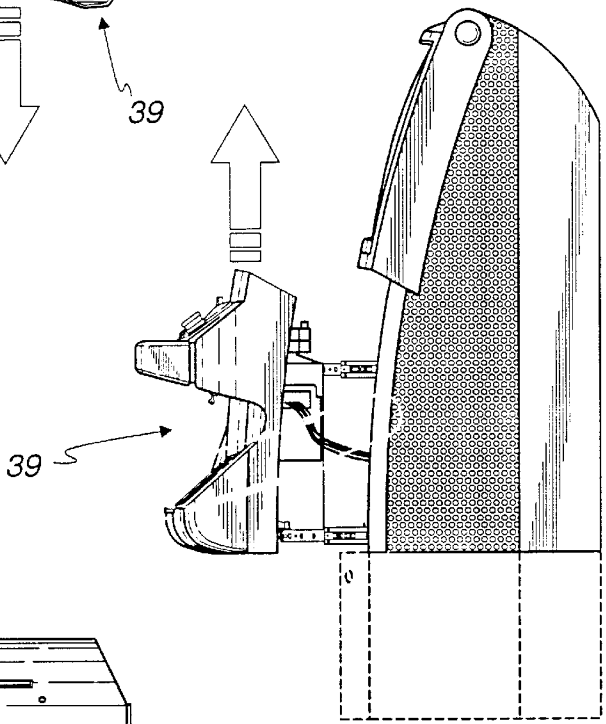
FIG. 11 is similar to FIG. 10 except that it is a side-perspective view.
Figure 12:
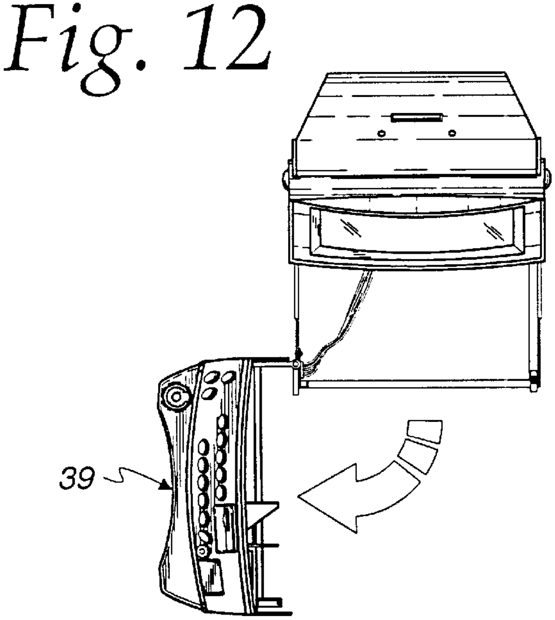
FIG. 12 is a top perspective view of the gaming machine housing illustrated in FIG. 1, shown with the door chassis in an extended position and the door in an open position.

In accordance with an important aspect of the gaming machine housing, the lower front housing portion 39 may be mounted to the gaming machine in a manner to enable it to be pulled out to an extended position as generally shown in FIGS. 10 and 11 and to pivot as generally shown in FIG. 12 from the extended position. This configuration allows gaming machines to be placed closer together while at the same time providing full access to the interior of the gaming machine.

Figure 5:
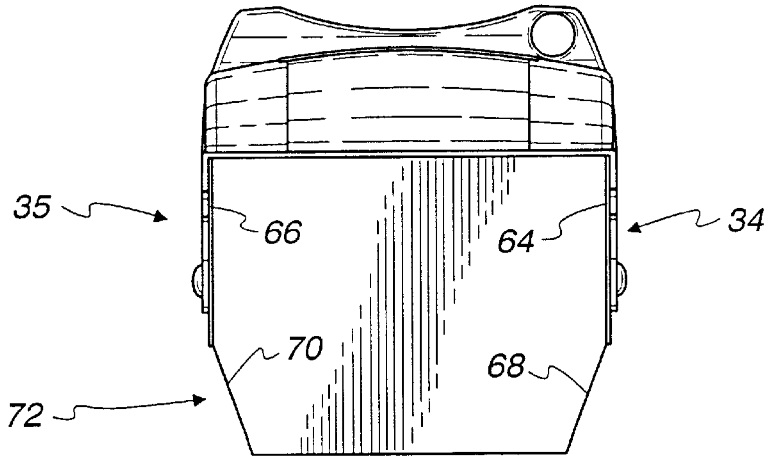
FIG. 5 is a bottom perspective view of the gaming machine housing illustrated in FIG. 1.
Figure 6:
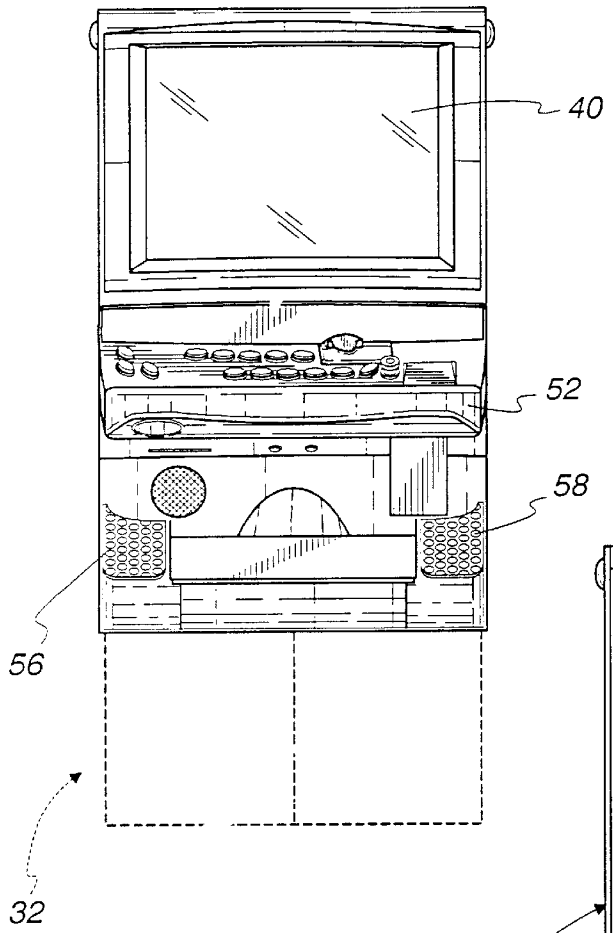
FIG. 6 is a front-elevational view of the gaming machine housing illustrated in FIG. 1.
Figure 7:
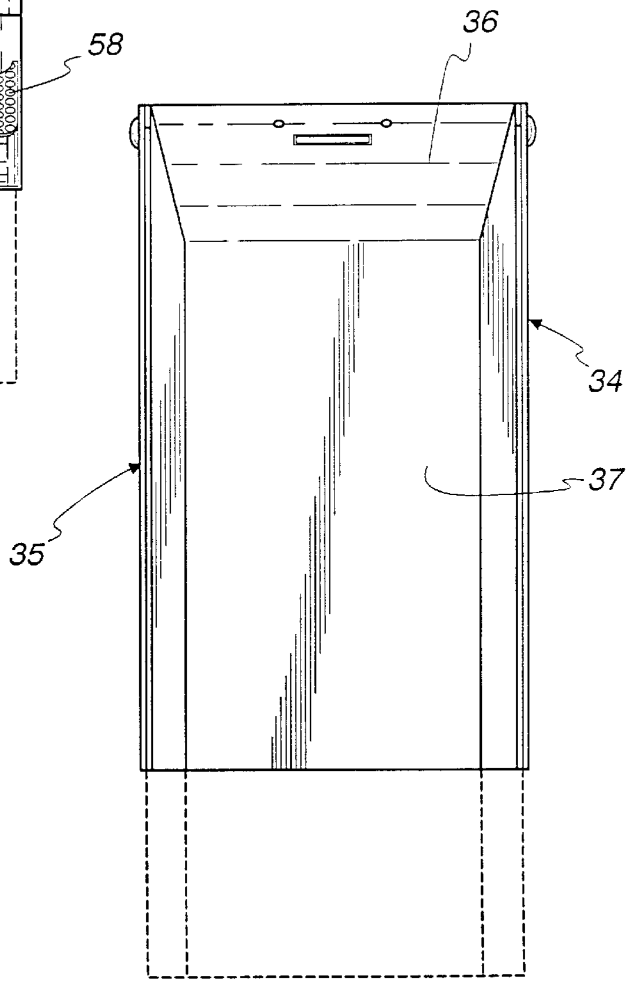
FIG. 7 is a rear-elevational view of the gaming machine housing illustrated in FIG. 1.
Figure 8:
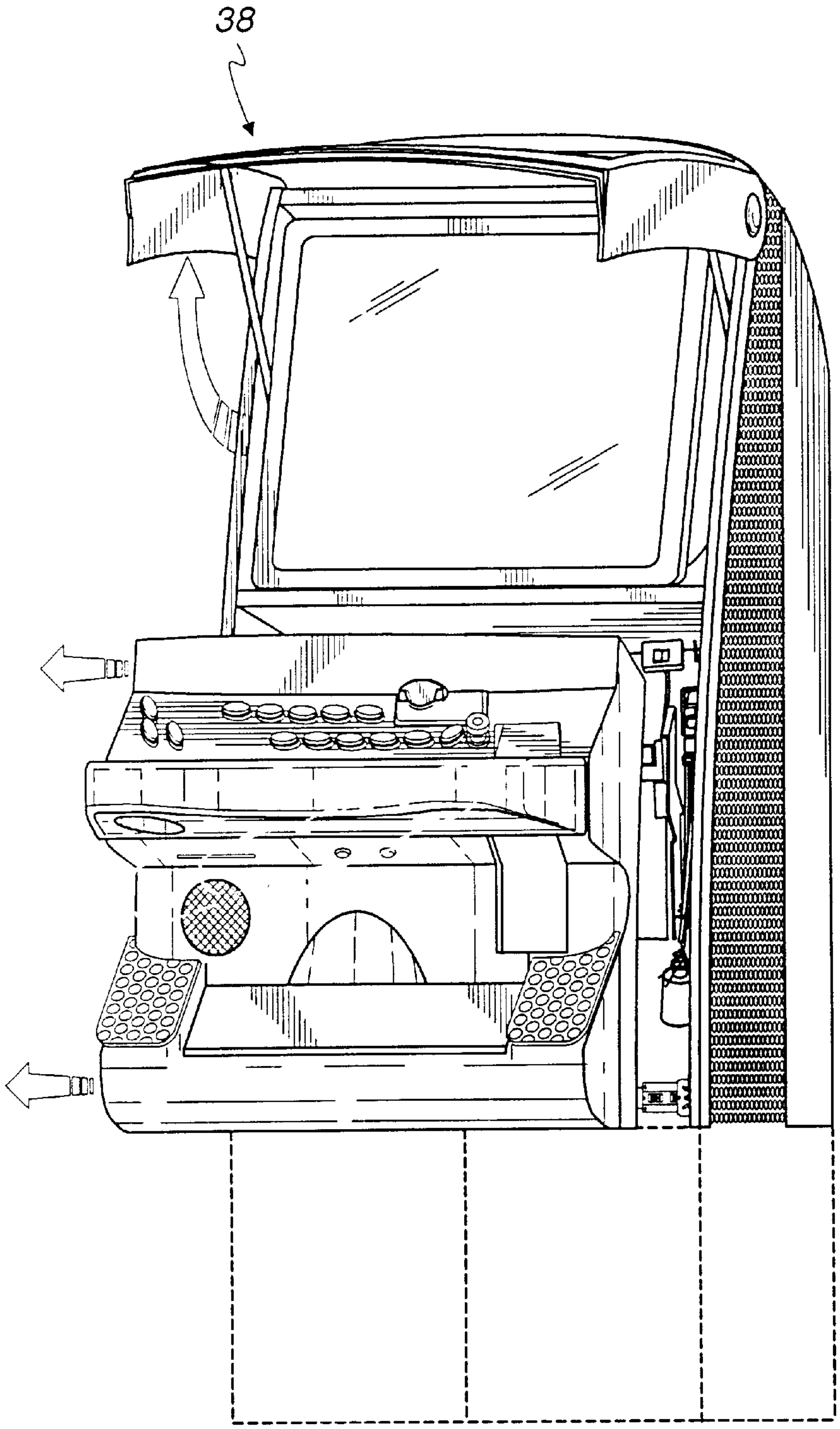
FIG. 8 is a front perspective view of the gaming machine housing illustrated in FIG. 1, shown with an upper front housing portion in an open position and the lower front housing portion partially pulled out.
Figure 9:
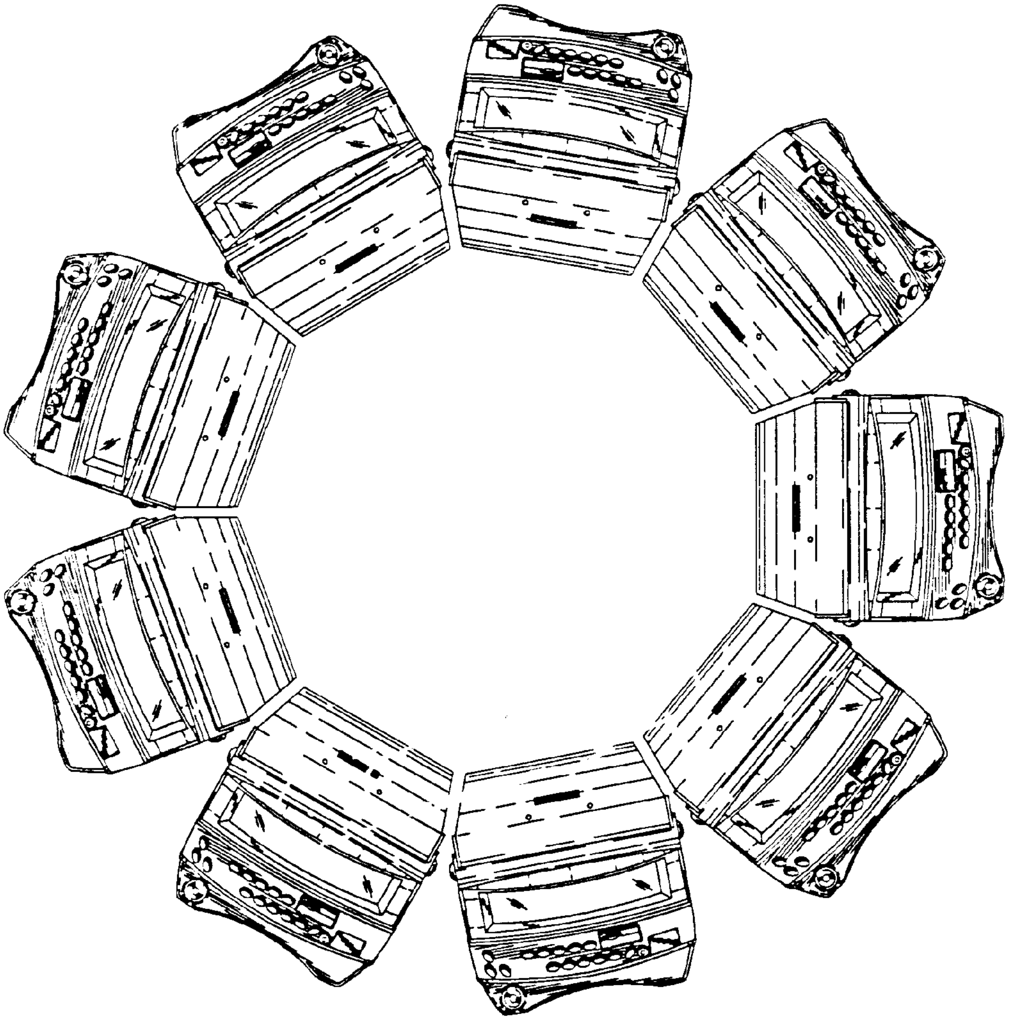
FIG. 9 is a top view of a circular cluster of gaming machine housing in accordance with the present invention illustrated in FIG. 1.

Referring to FIGS. 1–8, an exemplary gaming machine housing 30 is illustrated which includes a front housing portion 33 (FIGS. 2 and 3), left and right side housing portions, 34 and 35, respectively (FIGS. 1, 5 and 7), a top housing portion 36 (FIG. 7), a rear housing portion 37 (FIG. 7) and a bottom housing portion 72 (FIG. 5). The front housing portion 33 (FIGS. 2 and 3) may be divided into an upper front housing portion 38 (FIGS. 1 and 8) and a lower front housing portion 39 (FIG. 1). The upper front housing portion 38 may be pivotally mounted, for example, about a pivot axis 41 to enable the upper front housing portion 38 to be pivoted from a closed position, as shown in FIG. 1, to an open position, as shown in FIG. 8, to provide access to the video display 40 (FIG. 1) for maintenance and replacement. In order to prevent unauthorized access into the gaming machine 30, a latch or other locking arrangement (not shown) may be is used to secure the upper front housing 38 in a latched position as shown in FIG. 1).

The upper front housing portion 38 is used to frame a video display 40, for example, a cathode ray tube video display. As such, the upper front housing portion 38 is provided with a central rectangular aperture 43, sized in accordance with the dimensions of the video display 40, and formed with beveled surfaces 45 around the rectangular aperture 43 to frame the video display 40 and eliminate any gaps between the video display 40 and the upper front housing portion 38. The upper front housing portion 38 may also be formed with extending sidewalls 42, 44 (FIGS. 2 and 3) adapted to overlap the left and right side housing portions 34 and 35, respectively, in a closed position as shown in FIGS. 2 and 3.

The lower front housing portion 39 is formed with a first surface 46 (FIGS. 1–3). The angle of the first surface 46 is selected so that it is coplanar with the upper front housing portion 38, as best shown in FIGS. 2 and 3. The lower front housing portion 39 may also be provided with a second surface 48 that is not parallel to the plane of the first surface 46. The second surface 48 may be generally planar and configured at an angle B (FIG. 3) with respect to a horizontal datum 50. The angle B is selected to promote player comfort and minimize player fatigue, for example, an acute angle in the range from 10° to 70°, preferably 25° to 45°. As best shown in FIGS. 2 and 3, the lower front housing portion 39 may be provided with sidewalls 60 and 62. These sidewalls 60 and 62 overlap the left and right side housing portions 34 and 35 in a closed position, as shown in FIGS. 1–3.

An integral or separately formed convenience shelf 52 (FIGS. 1–3) may be provided which extends generally parallel relative to the horizontal datum 50 (FIG. 2). The convenience shelf 52 may be provided with a cup holder 54 and provide shelf space for the convenience of the players.

In accordance with an important aspect of the invention, the left and right side housing portions 34 and 35 are configured to reduce the overall footprint of the gaming machine. As best shown in FIGS. 2, 3 and 5, the left and right side housing portions 34 and 35 are formed to be generally symmetric and non-planar in configuration. In particular, referring to FIG. 5, the left and right side housing portions 34 and 35 are formed with generally parallel surfaces 64 and 66, respectively, and converging angled surfaces 68 and 70, respectively. As such, as shown in FIG. 5, the footprint of the machine is not rectangular but includes a trapezoidal portion, generally identified with the reference numeral 72, which enables the gaming machines to be arranged in various configurations including the circular configuration illustrated in FIG. 9 to enable more gaming machines to be located in a given area on a casino floor or other gaming facility.

INTEGRATED FOOTRESTS

Normally, footrests are provided on gaming machine stools. In order to increase player comfort, a pair of footrests 56, 58 (FIGS. 1–3) are provided on the lower front housing portion 39 of the housing 30. These footrests 56, 58 may be integrally formed in the lower front housing portion 39 of the housing or formed separately and rigidly secured thereto. As shown best in FIGS. 1–3, the footrests 56, 58 are formed near the bottom of the lower front housing portion 39 on each end. As shown in FIGS. 1 and 2, the integrated footrests 56 and 58 are located at a height above the height of the footrests 74 (FIGS. 21, 22) provided on the game chair 29. The integral footrests 56 and 58 located on the lower front housing portion 39 provide increased player comfort by enabling a player to lean back and rest their feet as the game is played, as shown in FIG. 22.

The footrests 56, 58 are formed from angled surfaces, for example, at an angle C (FIG. 22) relative to a horizontal datum 50. The angle C is selected to optimize player comfort, for example between 20°–70°. As best shown in FIG. 1, the footrests 56, 58 may be provided with rubber pads 76 and 78, which may be secured to the footrests 56 and 58 with a suitable adhesive.

DUAL ACTION DOOR HINGING

Access doors are normally provided on the front of gaming machines to provide access to the interior of the machine for in-situ maintenance and repair of the gaming machine on the casino floor. Such access doors limit how close gaming machines may be placed on a casino floor. More specifically, access doors normally are provided on the lower front portion of the gaming machine. Such access doors are normally hinged on one end. Unfortunately, the configuration of such gaming machines limits how close gaming machines can be placed while still enabling the access door to be fully opened. In particular, in many known gaming machines, the player controls are carried by an outwardly extending surface which extends outwardly relative to the plane of the access door. Such a configuration requires a certain amount of spacing between the machines in order for the access door to have sufficient clearance to be fully opened. In order to minimize the spacing between gaming machines, a dual-action access door in accordance with the present invention is provided which allows gaming machines to be placed relatively close together while at the same time providing the full access to the interior of the machine. In particular, FIGS. 10–20 illustrate a dual-action door assembly that enables the lower front housing portion 39 to be opened much like a file cabinet drawer from a closed position, as generally shown in FIG. 1, to an extended position as shown in FIGS. 10 and 11. Provisions are also provided to enable the lower front housing portion 39 to pivot in an extended position as shown in FIG. 12 to enable full access to the interior of the gaming machine for in-situ maintenance.

Figure 14:
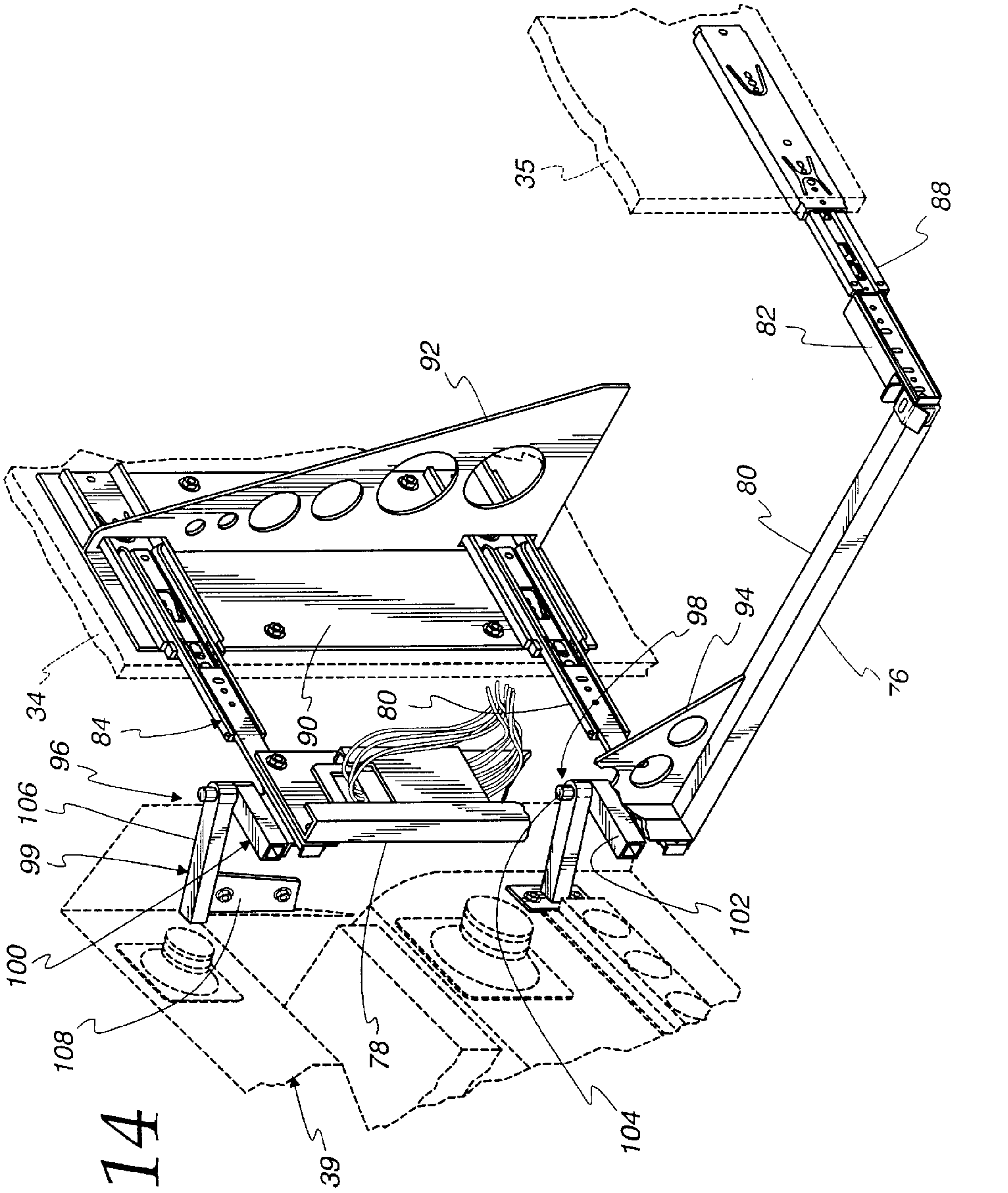
FIG. 14 is similar to FIG. 13 but with portions of the gaming machine and door chassis removed to more clearly illustrated the door chassis and door hinges.

Referring to FIG. 14, the lower front housing portion 39 is carried by a door chassis assembly, generally identified with the reference member 76. The door chassis assembly 76 includes a vertical frame member 78 and two horizontal frame members 80 and 82. The vertical frame member 78 and one of the horizontal frame members 80 are joined together at their respective ends to form an L-shaped configuration, generally parallel to the vertical datum 32 (FIG. 2). An opposing end of the horizontal frame 80 (FIG. 14) is connected to one end of the horizontal frame member 82 forming an L-shaped configuration, generally parallel to horizontal datum 50 (FIG. 3). Three telescoping drawer rails, 84, 86 and 88 are rigidly secured on one end to the frame members 78 and 82, for example, with suitable fasteners or by welding.

The horizontal frame members 80 and 82 may be formed with generally square or rectangular cross-sections. However, frame member 78 may be formed from J-channel for additional stiffening. The telescoping drawer rails 84 and 86 are rigidly attached to one end to the vertical frame member 78 with suitable fasteners. The drawer rail 88 is attached on one end to the horizontal frame member 82. The opposing ends of the drawer rails 84, 86 and 88 are attached to the interior of the left and right housing portions 34 and 35 with suitable fasteners. In order to provide additional stiffening, stiffening plates may be used. For example, a stiffening plate 90 may be attached directly to the interior of the left side housing portion 43 with suitable fasteners. The drawer rails 84 and 86 may then be attached to the stiffening plate 90.

Figure 13:
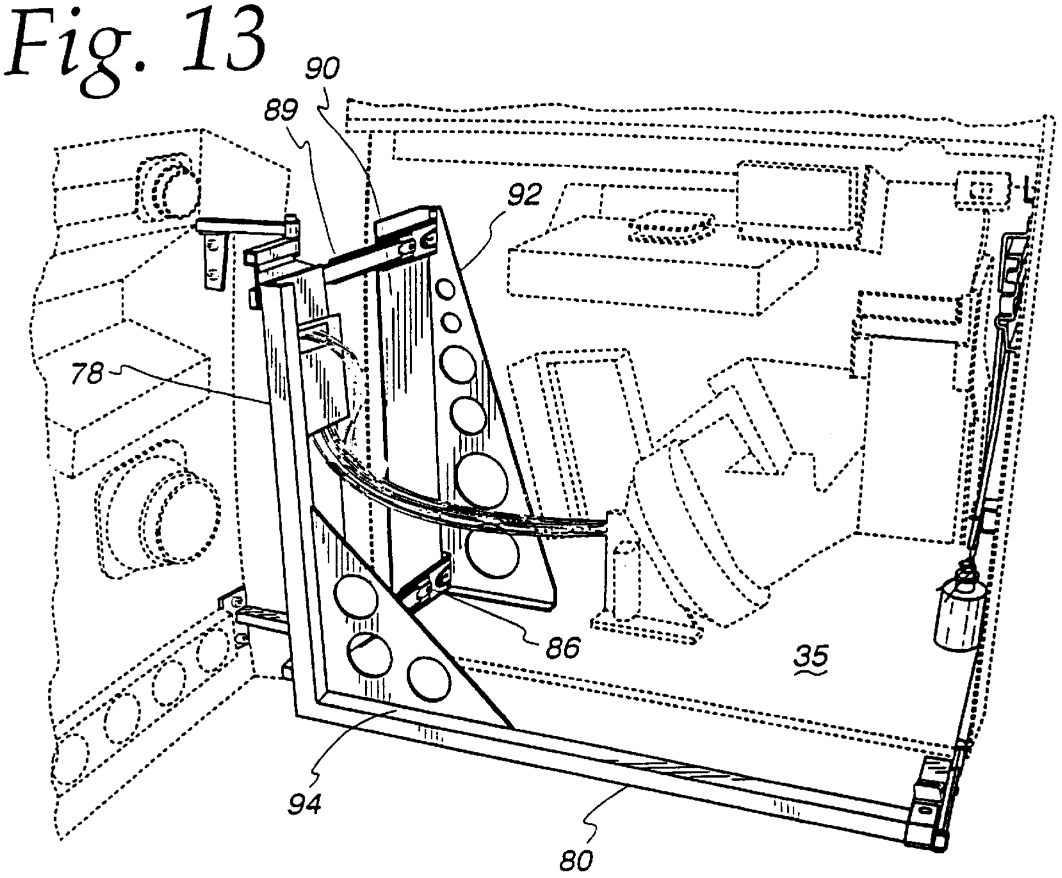
FIG. 13 is a partial perspective view of the gaming machine housing illustrated in FIG. 1, illustrated with the door chassis in an extended position and the door in an open position and shown with the interior of the gaming machine in phantom.

In order to provide additional stiffening, a gusset plate 92 may be rigidly attached to the stiffening plate 90 and rest on the bottom housing portion 72 (FIG. 5) as shown in FIGS. 13 and 14. An additional gusset plate 94 may be rigidly secured in the corner of the vertical frame member 78 and the horizontal frame member 80. The gusset plate 94 provides additional stiffening of the door chassis 76.

The door chassis assembly 76 enables the lower front housing portion 39 to slide out in a similar manner to a file drawer from a closed position as shown in FIG. 1 to an extended position as shown in FIGS. 10 and 11. In accordance with another aspect of the invention, the lower front housing portion 39 is pivotally mounted on one end about an axis generally parallel to a vertical datum 32 (FIG. 2). The pivotal mounting enables the lower front housing portion 39 to pivot from a closed position when the door chassis assembly 76 is in a partially or fully extended position as shown in FIGS. 10 and 11 to an open position as shown in FIG. 12, thus providing a dual-action door.

In order to pivotally mount the lower front housing portion 39 relative to the door chassis 76, upper and lower hinge assemblies 96 and 98 are provided. Each hinge assembly 96, 98 includes two brackets 99, 100. The brackets 99 are rigidly attached to the interior of the front housing portion 39 while the brackets 100 are attached to the vertical support 78. Each of the brackets 99 are formed from a horizontal member 102 and a pin 104 configured to be generally parallel to the vertical datum 32 (FIG. 2) when secured to the vertical supports 78 defining a vertical pivot axis. The brackets 100 are formed from a pair of members 106, 108 configured in a generally L-shape. The members 106 are provided with apertures (not shown) for receiving the pins 104 to enable the lower front housing portion 39 to pivot about a vertical axis on the left side of the lower front housing portion 39.

The right side of the lower front housing portion 39 is secured by upper and lower latch assemblies 110 and 112 respectively. The upper latch assembly 110 is illustrated in FIGS. 19 and 20 while the lower latch assembly 112 is illustrated in FIGS. 15–17.

Figure 15:
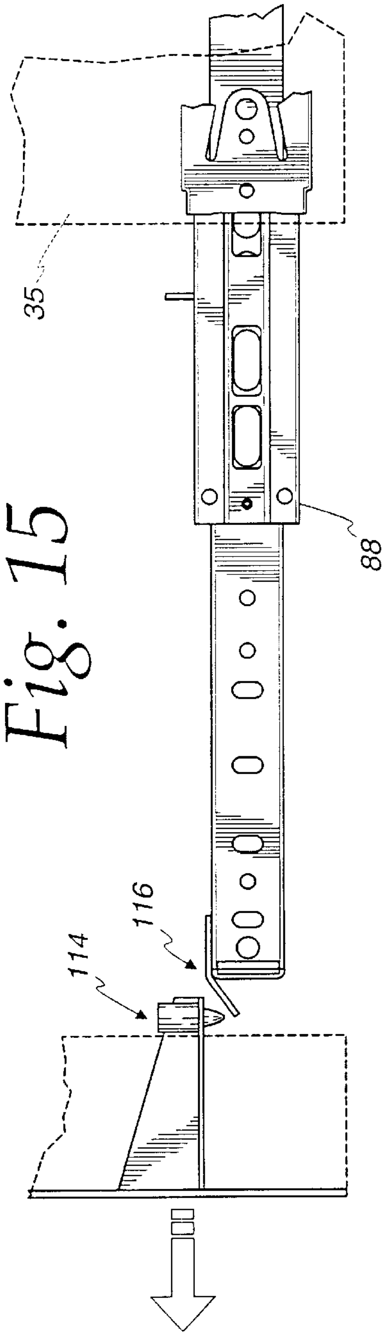
FIG. 15 is a partial elevational view illustrating the door rail which forms a part of the door chassis in an extended position.
Figure 17:
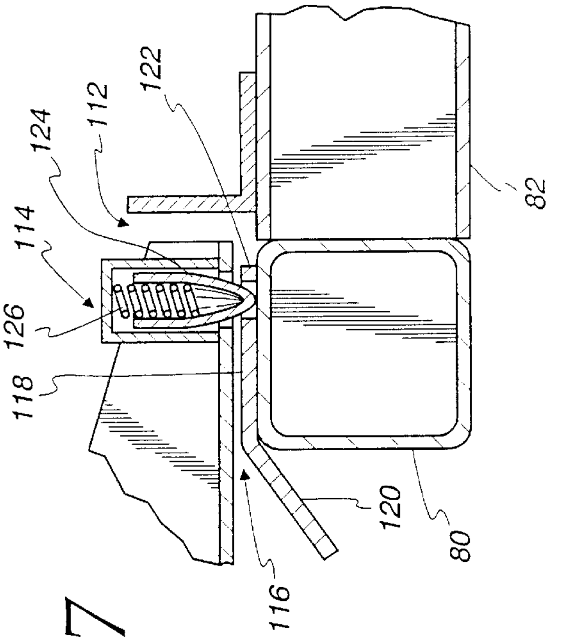
FIG. 17 is a partial sectional view of a position of the door chassis, shown with the door closed, illustrating the bottom door latch assembly.
Figure 16:
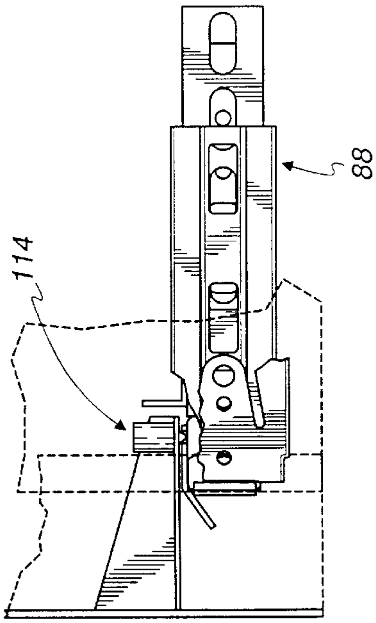
FIG. 16 is similar to FIG. 15 but in retracted or closed position.

Referring first to FIGS. 15–17, the lower latch assembly 112 includes a bullet pin assembly 114 and a latch plate 116. The latch plate 116 is formed with a flat surface 118, attached or secured to the horizontal frame member 80 and a ramped surface 120. The flat surface 118 is formed with an aperture 122 for latching the bullet pin assembly 114 as generally shown in FIG. 17. The bullet pin assembly 114 includes a bullet pin 124, spring loaded by way of a spring 126, as best shown in FIG. 17. In a latched position as shown in FIG. 17, the bullet pin 124 is biased downwardly into the aperture 122.

The tension of the spring 126 is selected such that a relatively small horizontal force on the lower front housing portion 39 causes the bullet pin 124 to move upwardly and compress the spring 126, thus unlatching the bullet pin assembly 114 from the latch plate 116, as generally shown in FIG. 15. The ramped surface 120 on the latch plate 116 causes the bullet pin 124 to move upwardly, thus compressing the spring 126, as the lower front housing portion 39 is moved toward a closed position as shown in FIGS. 10 and 11. The compression forces of the spring 126 bias the bullet pin 124 downwardly as the top of the bullet pin 124 slides across the flat surface 118 of the latch plate 116. Once the bullet pin 124 is over the aperture 122 in the latch plate 116, the bullet pin 124 is biased downwardly as shown in FIG. 17, latching the right lower portion of the lower front housing position 39 to the door chassis 76.

Figure 20:
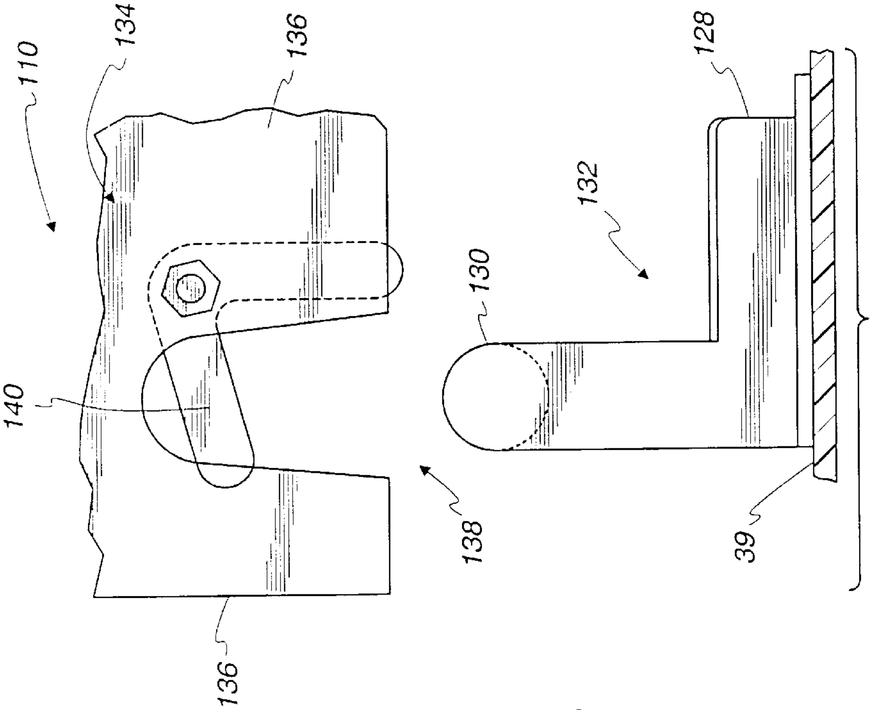
FIG. 20 is similar to FIG. 19 but in an unlatched position and the door partially opened.
Figure 19:
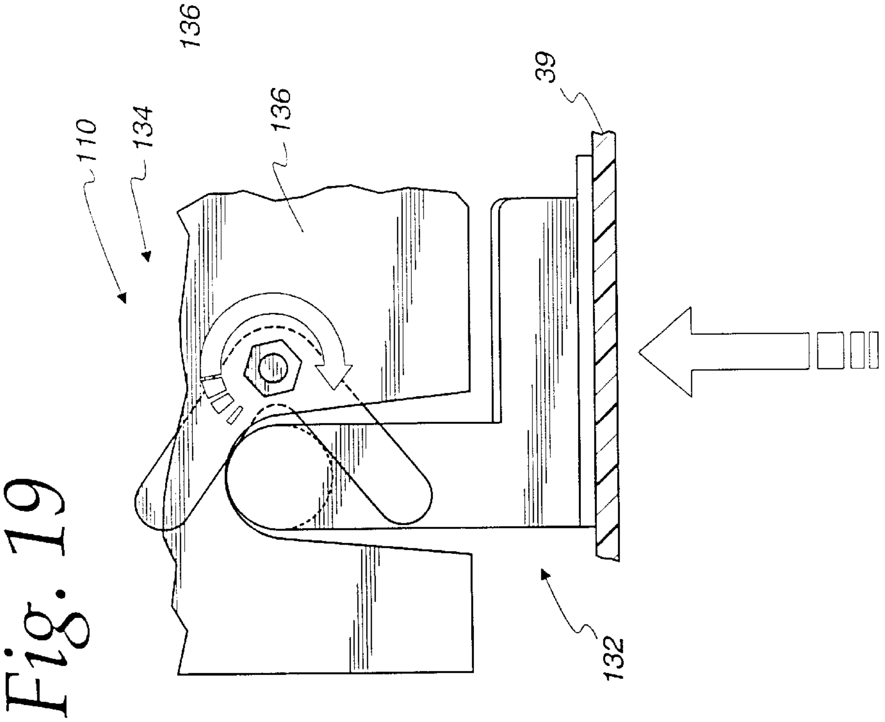
FIG. 19 is partial elevational view with portions of the gaming machine removed illustrating the upper door latch assembly in a latched position.

FIGS. 19–20 illustrate the upper latch assembly 110. The upper latch assembly 110 is used to latch the upper right side of the lower front housing portion 39 in a closed position for example as shown in FIG. 1. The upper latch assembly 110 must be latched in order to allow the door chassis assembly 76 to be pulled out to an extended position as shown in FIGS. 13 and 14. The upper latch assembly 110 is similar to a case door latch assembly and includes pair of parallel spaced apart L-shaped brackets 128 and a pin 130 extending there between forming a bracket assembly 132. The bracket assembly 132 is rigidly attached to the interior of the lower front portion 39 access door.

A latch subassembly 134 is formed on the interior of the right side housing portion 35. The latch subassembly 134 includes a plate 136, rigidly attached to the right housing portion 35 and a generally U-shaped slot 138. The pin 130 on the bracket assembly 132 is adapted to be received in the U-shaped slot 138 as generally shown in FIG. 19. A latching mechanism formed from a pivotally mounted L-shaped member 140 is used to capture the pin 130 in the slot 138 in a latched position as generally shown in FIG. 20. When the L-shaped member 140 is rotated counter-clockwise, as generally shown in FIG. 20, the pin 130 is released to allow the lower front housing portion 39 to be unlatched.

Figure 18:
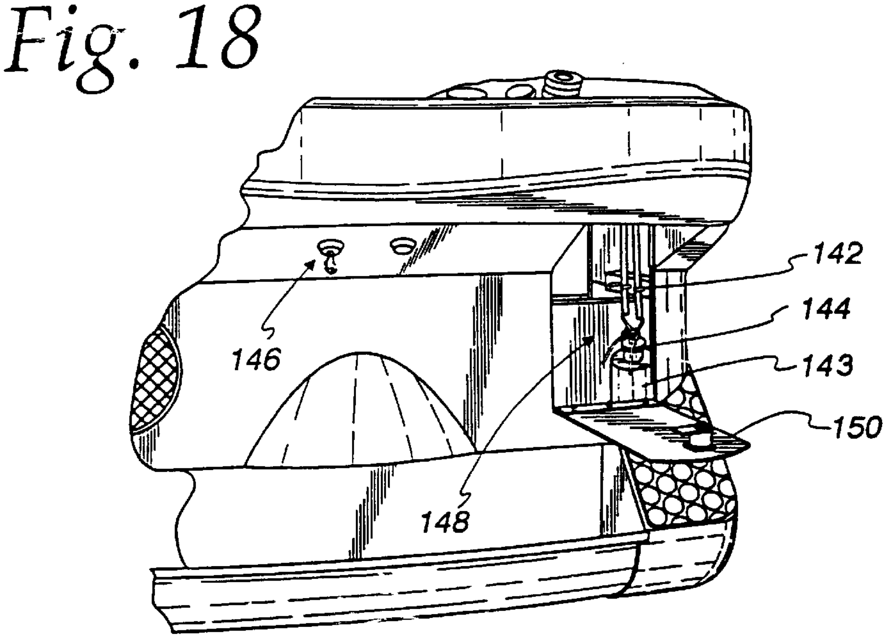
FIG. 18 is a partial perspective view of the gaming machine housing illustrated in FIG. 1, illustrating an access door in an open position and revealing a portion of the upper door latch assembly.

Normally the L-shaped member 140 is spring loaded in a clockwise direction to force the L-shaped member into the position as generally shown in FIG. 19. A release cable 142 (FIG. 18) is attached to one end of the L-shaped member 140. The release cable 142 is used to overcome the spring force in order to rotate the L-shaped member 140 in a counter-clockwise position as generally shown in FIG. 20 in order to release the pin 130. The other end of the release cable 142 may be attached to a solenoid 143 (FIG. 18). In a normal position, the solenoid 143 is not powered and thus does not tension the release cable 142. When electrical power is applied to the solenoid 143, a plunger 144 on the solenoid 143 is retracted to place tension on the release cable 142 in order to rotate the L-shaped member 140 (FIG. 20) to enable the lower front housing portion 39 to be unlatched.

The solenoid 143 (FIG. 8) may be key operated. For example, as shown in FIG. 18, a key-operated switch 146 may be located on the housing 30. Thus, when a key is inserted and turned to the on position, the solenoid 143 is powered up in order to enable the upper latch assembly 110 to be released. However, use of the solenoid 143 requires that the machine be connected to a source of electrical power.

In the event of a power failure or need to access the machine when no power is available, a portal 148 (FIG. 18) may be provided on the front portion of the lower front housing portion 39, adjacent the solenoid 143. As shown in FIG. 18 the portal 148 may be is hinged at the bottom and may be secured at the top with a simple key latch 150. During conditions when electric power is not available, the portal 148 is simply opened and tension manually placed on the release cable 142 to unlatch the upper latch assembly 110.

REMOTE BET BUTTON

In order to improve the player comfort, an extendable bet button, generally identified with the reference numeral 152 (FIGS. 22–24), provides additional player comfort. For example, as illustrated in FIG. 21, a player is shown at a gaming machine in a first conventional position. In this position, the player is forced to sit at arm's length to the gaming machine controls. The extendable bet button 152 allows the player to lean back and play the game while in a more comfortable position as shown in FIG. 22.

Figure 23:
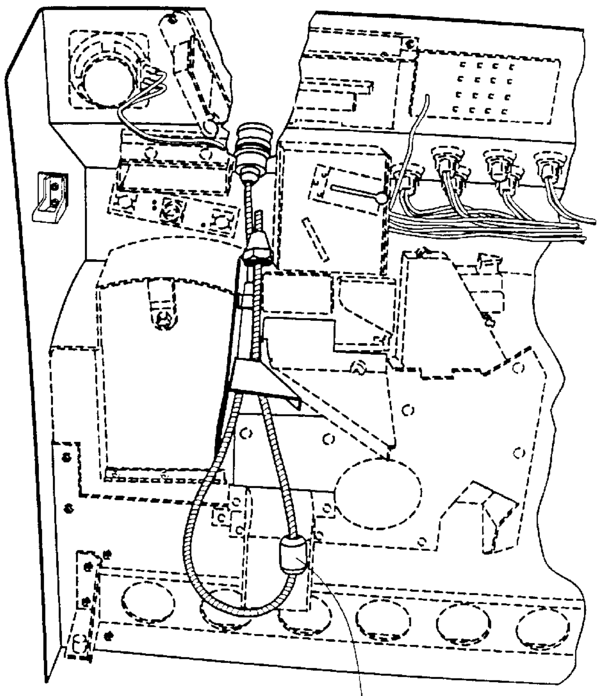
FIG. 23 is a partial view of the interior side of the door in phantom illustrating a bet button in a retracted position.

The extendable bet button 152 is disposed on the interior side of the lower front housing portion 39, as generally shown in FIGS. 22 and 23. FIG. 22 shows the extentable bet button 152 in a fully retracted position while FIG. 23 shows the extendable bet button in an extended position.

The extendable bet button 152 includes a conventional push button switch 154 (FIG. 24) and a rearwardly extending reduced diameter cylindrical member 156. The cylindrical member 156 is provided with a through hole for receiving an electrical cable 158 that is attached to the switch 154. The electrical cable 158 may be provided as an armored cable to minimize wear. A generally cylindrical grommet 160 is carried by the surface 48 (FIG. 1–3) on the lower front housing portion 39. The cylindrical grommet 160 includes a central aperture 162 for receiving the cylindrical member 156, as generally shown in FIG. 23.

Figure 24:
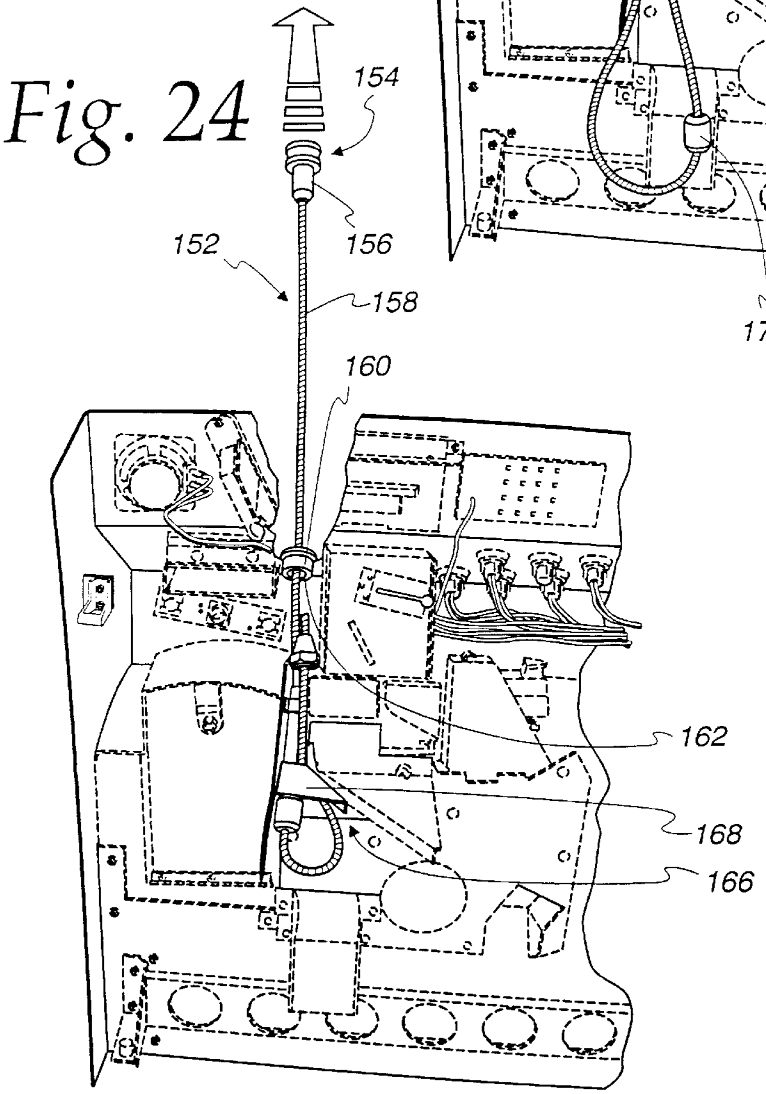
FIG. 24 is similar to FIG. 23 but showing the bet button in an extended position.

The cable 158 is attached on one end to the game controls (not shown) in a conventional manner. In order to prevent the extended bet button 154 from being disconnected from the gaming machine, a stop assembly 166 is provided. The stop assembly 166 includes a bracket 168 defining an access area which enables the cable 158 to freely slide through. A generally cylindrical weight 170 is attached around the armored cable 158 at a distance selected to prevent axial forces from being placed on the electrical connection to the gaming machine in an extended position. The cylindrical weight 170 has a relatively larger diameter than the cable 158. In a normal position, as shown in FIG. 23, the weight 170 rests in the interior of the lower front housing portion 39. When the bet button 154 is in an extended position as shown in FIG. 24, the diameter of the weight 170 is much larger than the access through the bracket 168 thus preventing further movement of the armored cable 158 stop as generally shown in FIG. 24.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A housing for a gaming machine comprising:
   - a front housing portion;
   - a pair of spaced apart side housing portions, said side housing portions being non-planar and with converging portions;
   - a top housing portion;
   - a rear housing portion; and
   - a bottom housing portion which forms a footprint for the machine a portion of said footprint having trapezoidal configuration.

2. The housing as recited in claim 1, wherein said front housing portion is formed from an upper front housing portion and a lower front housing portion.

3. The housing as recited in claim 2, wherein said upper front housing portion is formed as a frame for framing a video display.

4. The housing as recited in claim 3, further including one or more latch assemblies for latching said lower front housing portions.

5. The housing as recited in claim 2, wherein said upper front housing portion is pivotally mounted about a predetermined pivot axis.

6. The housing as recited in claim 5, wherein said predetermined pivot axis is generally horizontal.

7. The housing as recited in claim 2, wherein said lower front housing portion further includes a door chassis assembly to enable said lower front housing assembly to move between a fully closed position and an extended position.

8. The housing as recited in claim 7, further including one or more hinges to enable said lower front housing assembly to also pivot about an axis generally parallel to a vertical datum.

9. The housing as recited in claim 8, wherein said lower front housing portion is provided with game controls.

10. A gaming machine, comprising:
    - a housing comprising:
      - a front housing portion;
      - a pair of spaced apart side housing portions, said side housing portions being non-planar and with converging portions;
      - a top housing portion;
      - a rear housing portion; and
      - a bottom housing portion that forms a footprint for said machine, a portion of said footprint having a trapezoidal configuration;
    - a video display associated with said housing and adapted to display video gambling games images;

a value accepting device associated with said housing and adapted to receive value to be wagered on an outcome of a video gambling game; and a control panel associated with said housing and including a plurality of selection devices adapted to allow a user to control said video gambling game.

11. The gaming machine of claim 10, wherein said housing carries said video display in a plane that is at an angle relative to a vertical datum.

12. The gaming machine of claim 11, wherein said angle is in the range of 5° to 85° .

13. The gaming machine of claim 11, wherein said angle is in the range of 20° to 40°.

14. The gaming machine of claim 10, wherein said control panel is formed with a playing surface for carrying the plurality of selection devices, said playing surface formed at an angle relative to a horizontal datum.

15. The gaming machine of claim 14, wherein said angle is in the range of 10° to 70°.

16. The gaming machine of claim 14, wherein said angle is in the range of 25° to 45°.

17. The gaming machine of claim 10, wherein said front housing portion is formed from an upper front housing portion and a lower front housing portion.

18. The gaming machine of claim 17, wherein at least one of said upper front housing portion and said lower front housing portion is pivotally mounted.

19. A gaming machine, comprising:

a housing comprising:

a front housing portion;

a rear housing portion;

a pair of intermediate points disposed between said front housing portion and said rear housing portion; and a pair of spaced apart side housing portions, each of said side housing portions having a first side housing portion and a second side housing portion, each of said first side housing portions being disposed between said front housing portion and one of said intermediate points, each of said second side housing portions being disposed between said rear housing portion and one of said intermediate points, said second side housing portions comprising converging portions, said side housing portions being non-planar;

a video display associated with said housing and adapted to display video gambling game images;

a value accepting device associated with said housing and adapted to receive value to be wagered on an outcome of a video gambling game; and a control panel associated with said housing that allows a user to control said video gambling game;

wherein said housing carries said video display in a plane that is at an angle relative to a vertical datum and wherein said angle is in the range of 20° to 40°.

20. A gaming machine, comprising:

a housing comprising:

a front housing portion;

a rear housing portion;

a pair of intermediate points disposed between said front housing portion and said rear housing portion; and a pair of spaced apart side housing portions, each of said side housing portions having a first side housing portion and a second side housing portion, each of said first side housing portions being disposed between said front housing portion and one of said intermediate points, each of said second side housing portions being disposed between said rear housing portion and one of said intermediate points, said second side housing portions comprising converging portions, said side housing portions being non-planar;

a video display associated with said housing and adapted to display video gambling game images;

a value accepting device associated with said housing and adapted to receive value to be wagered on an outcome of a video gambling game; and a control panel associated with said housing that allows a user to control said video gambling game;

wherein said control panel is formed with a playing surface for carrying the plurality of selection devices, said playing surface formed at a an angle relative to a horizontal datum, and wherein said second angle is in the range of 10° to 70°.

21. A gaming machine, comprising:

a housing comprising:

a front housing portion;

a rear housing portion;

a pair of intermediate points disposed between said front housing portion and said rear housing portion; and a pair of spaced apart side housing portions, each of said side housing portions having a first side housing portion and a second side housing portion, each of said first side housing portions being disposed between said front housing portion and one of said intermediate points, each of said second side housing portions being disposed between said rear housing portion and one of said intermediate points, said second side housing portions comprising converging portions, said side housing portions being non-planar;

a video display associated with said housing and adapted to display video gambling game images;

a value accepting device associated with said housing and adapted to receive value to be wagered on an outcome of a video game; and a control panel associated with said housing that allows a user to control said video gambling game;

wherein said control panel is formed with a playing surface for carrying the plurality of selection devices, said playing surface formed at an angle relative to a horizontal datum, and wherein said an angle is in the range of 25° to 45°.

22. A gaming machine, comprising:

a housing comprising:

a front housing portion;

a pair of spaced apart side housing portions, each of said side housing portions having a planar portion and a converging portion, each of said planar portions coupled to said front housing portion and each of said converging portions coupled together;

a top housing portion; and a video display associated with said housing and adapted to display video gambling game images;

a value accepting device associated with said housing and adapted to receive value to be wagered on an outcome of a video gambling game; and a control panel associated with said housing that allows a user to control said video gambling game;

wherein said housing carries said video display in a plane that is at a an angle relative to a vertical datum and wherein said angle is in the range of 20° to 40°.

23. A gaming machine, comprising:

a housing comprising:

a front housing portion;

a pair of spaced apart side housing portions, each of said side housing portions having a planar portion and a converging portion, each of said planar portions coupled to said front housing portion and each of said converging portions coupled together;

a top housing portion; and a video display associated with said housing and adapted to display video gambling game images;

a value accepting device associated with said housing and adapted to receive value to be wagered on an outcome of a video gambling game; and a control panel associated with said housing that allows a user to control said video gambling game;

wherein said control panel is formed with a playing surface for carrying the plurality of selection devices, said playing surface formed at an angle relative to a horizontal datum, and wherein said angle is in the range of 10° to 70°.

24. A gaming machine, comprising:

a housing comprising:

a front housing portion;

a pair of spaced apart side housing portions, each of said side housing portions having a planar portion and a converging portion, each of said planar portions coupled to said front housing portion and each of said converging portions coupled together;

a top housing portion; and a video display associated with said housing and adapted to display video gambling game images;

a value accepting deice associated with said housing and adapted to receive value to be wagered on an outcome of a video gambling game; and a control panel associated with said housing that allows a user to control said video gambling game;

wherein said control panel is formed with a playing surface for carrying the plurality of selection devices, said playing surface formed at an angle relative to a horizontal datum, and wherein said angle is in the range of 25° to 45°.

25. A gaming machine, comprising:

a housing comprising:

a front housing portion;

a rear housing portion;

a pair of intermediate points disposed between said front housing portion and said rear housing portion; and a pair of spaced apart side housing portions, each of said side housing portions having a first side housing portion and a second side housing portion that does not lie in the same plane as said first side housing portion, each of said first side housing portions being disposed between said front housing portion and one of said intermediate points, each of said second side housing portions being disposed between said rear housing portion and one of said intermediate points, said second side housing portions comprising converging portions;

a video display associated with said housing and adapted to display video gambling game images;

a value accepting device associated with said housing and adapted to receive value to be wagered on an outcome of a video gambling game; and a control panel associated with said housing that allows a user to control said video gambling game;

wherein said housing carries said video display in a plane that is at a first angle relative to a vertical datum and wherein said angle is in the range of 20° to 40°.

26. A gaming machine, comprising:

a housing comprising:

a front housing portion;

a rear housing portion;

a pair of intermediate points disposed between said front housing portion and said rear housing portion; and a pair of spaced apart side housing portions, each of said side housing portions having a first side housing portion and a second side housing portion that does not lie in the same plane as said first side housing portion, each of said first side housing portions being disposed between said front housing portion and one of said intermediate points, each of said second side housing portions being disposed between said rear housing portion and one of said intermediate points, said second side housing portions comprising converging portions;

a video display associated with said housing and adapted to display video gambling game images;

a value accepting device associated with said housing and adapted to receive value to be wagered on an outcome of a video gambling game; and a control panel associated with said housing that allows a user to control said video gambling game;

wherein said control panel is formed with a playing surface for carrying the plurality of selection devices, said playing surface formed at an angle relative to a horizontal datum, and wherein said angle is in the range of 10° to 70°.

27. A gaming machine, comprising:

a housing comprising:

a front housing portion;

a rear housing portion;

a pair of intermediate points disposed between said front housing portion and said rear housing portion; and a pair of spaced apart side housing portions, each of said side housing portions having a first side housing portion and a second side housing portion that does not lie in the same plane as said first side housing portion, each of said first side housing portions being disposed between said front housing portion and one of said intermediate points, each of said second side housing portions being disposed between said rear housing portion and one of said intermediate points, said second side housing portions comprising converging portions;

a video display associated with said housing and adapted to display video gambling game images;

a value accepting device associated with said housing and adapted to receive value to be wagered on an outcome of a video gambling game; and a control panel associated with said housing that allows a user to control said video gambling game;

wherein said control panel is formed with a playing surface for carrying the plurality of selection devices, said playing surface formed at an angle relative to a horizontal datum, and wherein said angle is in the range of 25° to 45°.

* * * * *